(12) United States Patent
Weiser

(10) Patent No.: US 8,995,144 B1
(45) Date of Patent: Mar. 31, 2015

(54) ON BOARD WIRELESS MODULE ARCHITECTURE

(75) Inventor: William Weiser, Meridian, ID (US)

(73) Assignee: Marvell International Ltd., Hamilton (BM)

( * ) Notice: Subject to any disclaimer, the term of this patent is extended or adjusted under 35 U.S.C. 154(b) by 923 days.

(21) Appl. No.: 13/117,991

(22) Filed: May 27, 2011

Related U.S. Application Data

(60) Provisional application No. 61/357,469, filed on Jun. 22, 2010.

(51) Int. Cl.
  *H05K 7/00* (2006.01)
  *G06F 13/40* (2006.01)
(52) U.S. Cl.
  CPC .................................... *G06F 13/409* (2013.01)
  USPC .......................................... 361/760; 361/764

(58) Field of Classification Search
  CPC ................. G06F 13/409; H05K 1/142; H05K 2201/044; H05K 2201/10189; G06K 15/02
  USPC .......................... 361/760, 729, 764, 784, 749
  See application file for complete search history.

(56) References Cited

U.S. PATENT DOCUMENTS

| | | | |
|---|---|---|---|
| 7,864,352 B2 * | 1/2011 | Hull et al. ..................... | 358/1.15 |
| 2005/0239237 A1 * | 10/2005 | Puschner et al. .............. | 438/125 |
| 2005/0262497 A1 * | 11/2005 | Ternasky et al. .............. | 717/172 |
| 2008/0152246 A1 * | 6/2008 | Keithley et al. ............... | 382/254 |
| 2009/0031062 A1 * | 1/2009 | Shen et al. .................... | 710/100 |

* cited by examiner

*Primary Examiner* — Yuriy Semenenko

(57) ABSTRACT

Embodiments of the present disclosure provide an assembly comprising circuitry of a wireless module disposed on a first region of a circuit board, and circuitry of a host controller module disposed on a second region of the circuit board. The first region is removably coupled to the second region.

10 Claims, 4 Drawing Sheets

ON BOARD WIRELESS MODULE ARCHITECTURE

CROSS REFERENCE TO RELATED APPLICATIONS

The present disclosure claims priority to U.S. Provisional Patent Application No. 61/357,469, filed Jun. 22, 2010, the entire specification of which is hereby incorporated by reference in its entirety for all purposes, except for those sections, if any, that are inconsistent with this specification.

TECHNICAL FIELD

Embodiments of the present disclosure relate to the field of board architecture for wireless modules, and more particularly, to configurations of a host controller module and wireless module on a same board.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A wide variety of embedded products using wireless technologies are emerging to connect the embedded products to wireless networks. Worldwide homologation or certification of radio circuitry used in such embedded products is generally expensive.

SUMMARY

To mitigate expenses generally associated with certification processes, a modular radio certification process has been developed to allow many different products to use a circuit board design that has been pre-certified at a modular level to eliminate redundant testing expenses. Thus, modular radio circuitry is generally formed on a separate circuit board than other modules of an embedded product in order to take advantage of these certification cost savings. While using a separate circuit board for modular radio circuitry may reduce non-recurring engineering (NRE) testing costs, such solution burdens the product unit cost with manufacturing at least two separate printed circuit boards.

The present disclosure provides an assembly comprising circuitry of a wireless module disposed on a first region of a circuit board, and circuitry of a host controller module disposed on a second region of the circuit board. The first region is removably coupled to the second region.

The present disclosure also provides a method comprising forming circuitry of a wireless module on a first region of a circuit board, and forming circuitry of a host controller module on a second region of the circuit board. The first region is removably coupled to the second region.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Figure 1:
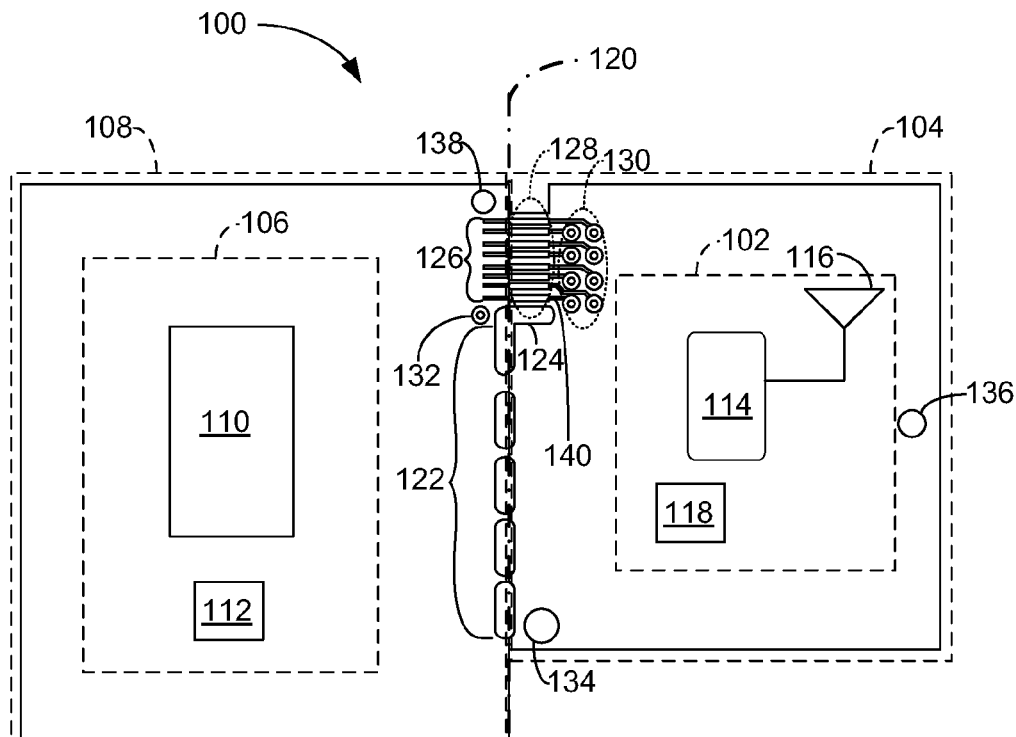
FIG. 1 schematically illustrates a circuit board having a wireless module disposed on a first region of the circuit board, and a host controller module disposed on a second region of the circuit board.
Figure 2:
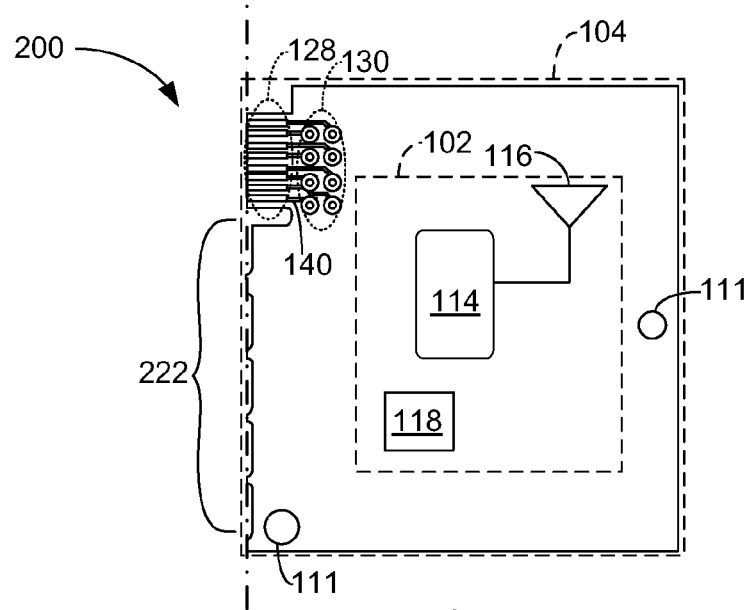
FIG. 2 schematically illustrates a diagram of the first region of the circuit board of FIG. 1 after physically separating the first region from the second region.

FIG. 1 schematically illustrates a circuit board 100 having a wireless module 102 disposed on a first region 104 of the circuit board 100 and a host controller module 106 disposed on a second region 108 of the circuit board 100. FIG. 2 schematically illustrates a diagram of the first region 104 of the circuit board 100 of FIG. 1 after having physically separated the first region 104 from the second region 108.

Referring to FIG. 1, the circuit board 100 is a single circuit board formed during a same fabrication process according to one embodiment. Accordingly, the circuit board 100 may be structurally and/or materially continuous and have a same thickness (e.g., the thickness extending in and out of the page of FIG. 1) in the first region 104 and the second region 108.

The first region 104 of the circuit board 100 is removably coupled to the second region 108 of the circuit board 100. That is, the circuit board 100 can be mechanically constructed to facilitate physical separation of the wireless module 102 from the host controller module 106. As can be seen in FIG. 1, a linear boundary 120 extends across the circuit board 100 and defines a boundary that separates the first region 104 from the second region 108 and the corresponding wireless module 102 formed on the first region 104 from the host controller module 106 formed on the second region.

In the illustrated embodiment of FIG. 1, the first region 104 is removably coupled to the second region using a perforation 122 formed along the linear boundary 120. The perforation 122 can include, for example, one or more openings formed along the linear boundary 120, as illustrated. The one or more openings can include an L-shaped opening 124 disposed adjacent to interface circuitry (e.g., one or more trace structures 128) that electrically couples the wireless module 102 to the host controller module 106. The L-shaped opening 124, configured as shown, facilitates access to the interface circuitry when the first region 104 is physically separated from the second region 108. The one or more openings can be formed completely or partially through the material of the circuit board 100 and can include other shapes or configurations that provide similar functionality, such as a trench, to facilitate physical separation along the linear boundary 120. Structures that facilitate physical separation other than the perforation 122 can be used in other embodiments.

Referring to FIGS. 1 and 2, according to various embodiments, the wireless module 102 is disposed in a location of the circuit board 100 that facilitates separation of the wireless module 102 from the host controller module 106 such that the wireless module 102 can be, e.g., physically separated and submitted for modular radio certification. For example, the separated first region 104 of circuit board 100 shown in FIG. 2 can serve as a specimen 200 for modular radio certification. As can be seen, the specimen 200 may include remnant perforation structures 222 from being separated along the perforation 122 of FIG. 1. After certification, design of the certified wireless module 102 must not change in order for a manufacturer to rely on the modular radio certification to manufacture other products that use the certified wireless module 102.

In an embodiment, the wireless module 104 is disposed at an extreme end of the circuit board 100 relative to the host controller module 106, as illustrated in FIG. 1. With this architecture, mechanical and/or electrical circuit aspects or other design of the host controller module 106 can be changed without changing the wireless module 102. This concept potentially allows a manufacturer of the circuit board 100 to sell or license, for example, a copyright image of the first region 104 including the wireless module 102 to a customer to include on an embedded product circuit board without having to go through an additional modular radio certification process for the wireless module 102.

Thus, a goal of a manufacturer of the circuit board 100 may be to provide a wireless module 102 that can be physically separated from the host controller module 106 and provide a wireless module 102 that is not changed from the modular certified version. Such goal is facilitated by architecture of the circuit board 100 that includes interface circuitry (e.g., the one or more trace structures 128) that electrically couples the wireless module 102 to the host controller module 106, as described herein.

The interface circuitry includes interconnection trace structures such as the one or more trace structures 128 that abut the linear boundary 120. According to various embodiments, the one or more trace structures 128 are finger structures that are disposed parallel to one another, as illustrated. The one or more trace structures 128 include an electrically conductive material that is exposed to provide a connection point for equipment that performs a modular radio certification process on the wireless module 102. That is, in an embodiment, the equipment that performs the modular radio certification process is configured to measure signals of the wireless module 102 using the one or more trace structures 128. According to various embodiments, the one or more trace structures 128 are configured to operate in accordance with a Universal Serial Bus (USB) specification including, for example, USB 1.0 released January 2006, USB 2.0 released April 2000, and other precursors or derivatives of these standards and related standards, although the embodiments discussed herein are not so limited. The one or more trace structures 128 can also be configured to operate in accordance with other specifications. For example, the one or more trace structures can also be configured to operate in accordance with Secure Card (SD) memory card specification.

The interface circuitry can further include trace routing structures 140 that electrically couple the one or more trace structures 128 to one or more contacts 130 formed in the first region 104. In an embodiment, each trace structure of the one or more trace structures 128 is electrically coupled to a respective contact of the one or more contacts 130, as illustrated. The one or more contacts 130 can include, for example, one or more pin connectors or other analogous structures that provide similar functionality.

Modular radio certification as described herein may refer to any certification of a wireless module including, for example, Wi-Fi certification. Wi-Fi is a certification mark for products that pass conformity and interoperability tests for the Institute of Electrical and Electronics Engineers (IEEE) 802.11 standards. Subject matter of the present disclosure is not limited in this regard and the modular radio certification can be provided by a wide variety of certifying bodies including, for example, Telecom Engineering Center (TELEC), European Telecommunications Standards Institute (ETSI), Federal Communications Commission (FCC), Certification and Engineering Bureau of Industry Canada (IC), and/or the Wi-Fi Alliance. Other wireless technologies and/or certifying bodies can be used to provide the modular radio certification in other embodiments.

Referring again to FIG. 1, the architecture of the circuit board 100 further allows test and/or calibration tools that are used to test and/or calibrate modular radios in production, to be licensed or provided to manufacturers of host controller modules 106 so that the manufacturers can test and/or calibrate the wireless module 102 portion of the combined circuit board 100 without requiring modification to currently used processes or test and/or calibration tools.

In order to facilitate such testing and/or calibration, the interface circuitry includes one or more trace structures 126 and a tri-state contact 132 formed in the second region 108. In an embodiment, each trace structure of the one or more trace structures 126 abuts the linear boundary 120 and is electrically coupled to a respective trace structure 128 of the one or more trace structures 128. The tri-state contact 132 is configured to tri-state or otherwise place the one or more trace structures 126 in a high impedance state that allows radio testing and/or calibration of the wireless module 102 as though the host controller module 106 is not coupled to the wireless module 102. For example, the tri-state contact 132 may be a pin that contacts and temporarily places the interface circuitry (e.g., the one or more trace structures 126) in the second region 108 in a state that allows a test fixture or similar testing equipment to access, test, and/or calibrate input/output (I/O) contacts (e.g., the one or more contacts 130) of the wireless module 102 disposed in the first region 104.

According to various embodiments, the interface circuitry including, e.g., the one or more trace structures 126 and the one or more trace structures 128, is part of a USB interface. In such embodiments, the one or more contacts 130 may serve as manufacturing test power and USB host contacts for the wireless module 102 during testing and/or calibration.

The architecture of the circuit board 100 further includes tooling connectors 134, 136 disposed in the first region 104 and tooling connector 138 disposed in the second region 108. The tooling connectors 134, 136, 138 are configured to orient testing equipment that is used to test and/or calibrate the wireless module 102. The tooling connectors 134, 136, 138 can include any suitable type of structure, including, for example, tooling holes or pins, that can be used to reliably locate the circuit board 100 in a test fixture by aligning features of the test fixture with the tooling connectors 134, 136, 138. The tooling connectors 134, 136, 138 are generally disposed at terminating edges of the circuit board 100, as illustrated.

The wireless module 102 includes circuitry that facilitates wireless communication with another device and/or a wireless network. The circuitry of the wireless module 102 can include, for example, radio circuitry 114 that is configured to communicate wirelessly. In an embodiment, the radio circuitry 114 is coupled to an antenna 116. In some embodiments, the radio circuitry 114 is configured to wirelessly communicate according to a Bluetooth standard or an Institute for Electrical and Electronic Engineers (IEEE) standard such as an IEEE 802.11 standard including, for example, IEEE 802.11b-1999, IEEE 802.11g-2003, and IEEE 802.11n, and other precursors or derivatives of these standards, although the embodiments discussed herein are not so limited.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

The wireless module 102 may be configured to communicate using a wireless network including, but not limited to, wireless local area networks (WLANs) and/or wireless personal area networks (WPANs) and the like. Other wireless network standards and/or protocols can also be supported.

The wireless module 102 can further include one or more additional integrated circuit (IC) components 118. The one or more additional IC components 118 represents any of a variety of processors, memory devices, or other IC device that is configured to facilitate wireless communication using the radio circuitry 114. In one embodiment, the one or more additional IC components 118 includes a memory device such as an Electrically Erasable Programmable Read-Only Memory (EEPROM) device to store calibration or other information obtained by testing and/or calibrating the wireless module 102 as described herein.

The host controller module 106 generally includes circuitry that facilitates connecting a host system to other network and/or storage devices. For example, the host controller module 106 can include one or more processors 110 and one or more memory devices 112. The one or more processors can include, for example, an Application Specific Integrated Circuit (ASIC). In one embodiment, the host controller module 106 is a printer formatter module, but is not limited in this regard. That is, the circuit board 100 can be part of any of a variety of embedded products/host systems including, for example, a computer, phone, printer, household appliance, medical device, and the like.

According to various embodiments, the first region 104 primarily or only includes the circuitry of the wireless module 102, the second region 108 primarily or only includes the circuitry of the host controller module 106, and the circuit board 100 primarily or only includes the first region 104 and the second region 108. In such embodiments, the first region 104 may be referred to as a "wireless portion" and the second region 108 may be referred to as a "host portion" of the circuit board 100.

Figure 3:
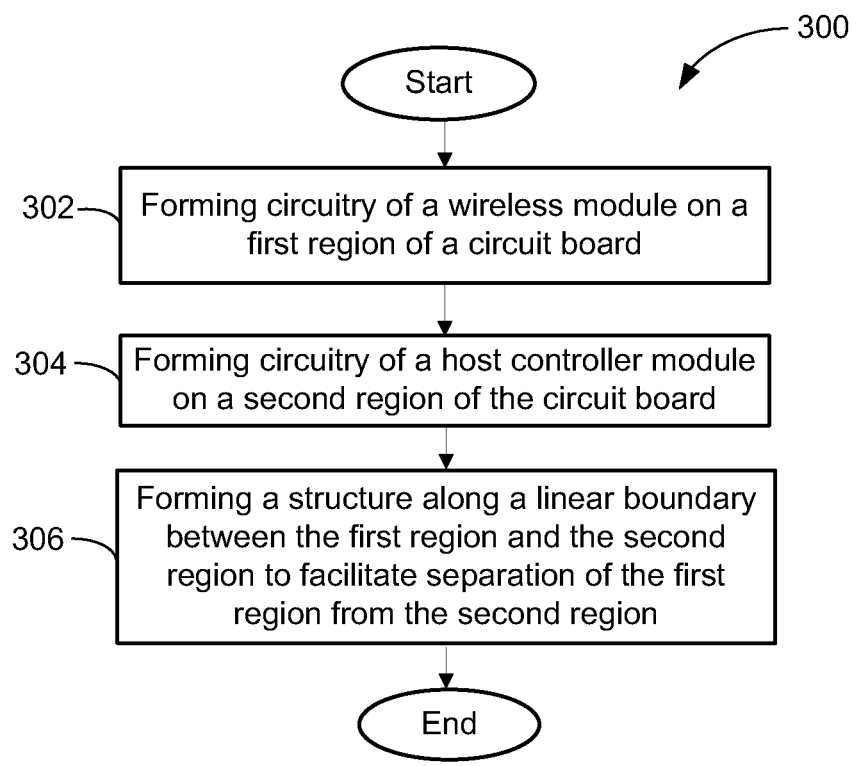
FIG. 3 schematically illustrates a flow diagram of a method of making a circuit board as described herein.

FIG. 3 schematically illustrates a flow diagram of a method 300 of making a circuit board (e.g., the circuit board 100 of FIG. 1) as described herein. At 302, the method 300 includes forming circuitry (e.g., the radio circuitry 114 of FIG. 1) of a wireless module (e.g., the wireless module 102 of FIG. 1) on a first region (e.g., the first region 104 of FIG. 1) of a circuit board.

At 304, the method 300 further includes forming circuitry (e.g., one or more processors 110 and/or memory devices 112 of FIG. 1) of a host controller module (e.g., the host controller module 106 of FIG. 1) on a second region (e.g., the second region 108 of FIG. 1). The circuitry of the wireless module and/or the host controller module can be formed according to well-known circuit board fabrication processes.

At 306, the method 300 further includes forming a structure along a linear boundary (e.g., the linear boundary 120 of FIG. 1) between the first region and the second region to facilitate separation of the first region from the second region. Such action provides a circuit board having a first region that is removably coupled to the second region. In an embodiment, a perforation (e.g., the perforation 122 of FIG. 1) is formed along the linear boundary. The perforation can be formed by providing one or more openings (e.g., the L-shaped opening 124) in the circuit board along the linear boundary. The one or more openings can be provided, for example, by stamping, etching, molding, drilling, or like processes, but is not limited in this regard. The one or more openings can be formed completely or partially through the circuit board. The perforation can include a single trench in some embodiments.

Figure 4:
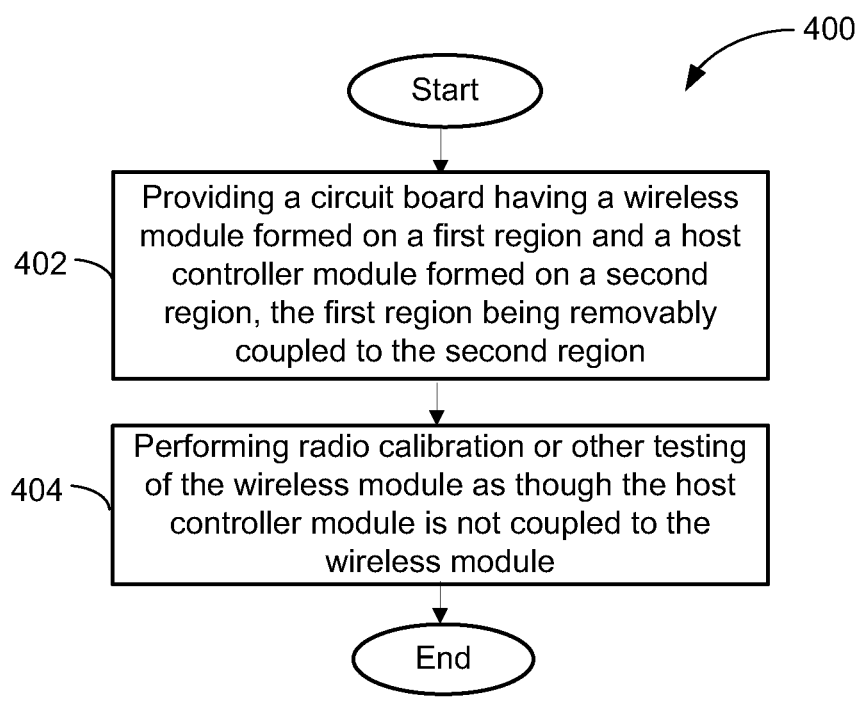
FIG. 4 schematically illustrates a flow diagram of a method of testing a circuit board as described herein.

FIG. 4 schematically illustrates a flow diagram of a method 400 of testing a circuit board (e.g., the circuit board 100 of FIG. 1) as described herein. The method 400 is generally performed as part of production/manufacture of the circuit board.

At 402, the method 400 includes providing a circuit board having a wireless module formed on a first region and a host controller module formed on a second region, the first region being removably coupled to the second region. For example, the circuit board provided at 402 can be a product of method 300.

At 404, the method 400 includes performing radio calibration or other testing of the wireless module as though the host controller module is not coupled to the wireless module. Such radio calibration or other testing can be performed by enabling a tri-state contact (e.g., the tri-state contact 132 of FIG. 1) disposed in the second region to place the host controller module or "host portion" of the circuit board in a high impedance state that allows radio calibration of the wireless module as though the host controller module is not coupled to the wireless module. The tri-state contact can be enabled, for example, by test equipment using an electronic signal.

The radio calibration or other testing of the wireless module can be performed by test equipment that is configured to communicate with the wireless module using interface circuitry that electrically couples the host controller module and the wireless module. The test equipment can be coupled, for example, to one or more trace structures (e.g., the one or more trace structures 128 of FIG. 1) or one or more contacts (e.g., the one or more contacts 130 of FIG. 1) of the interface circuitry to measure radio frequency (RF) output, calibrate frequency and/or magnitude of power of radio signals, and/or store the information (e.g., calibration values) in the wireless module 102. The test equipment can be equipped to transmit and/or receive the RF signal to the wireless module. One or more tooling connectors (e.g., the tooling connectors 134, 136, 138 of FIG. 1) can be used to facilitate alignment or orientation of the test equipment relative to the circuit board for testing purposes.

Figure 5:
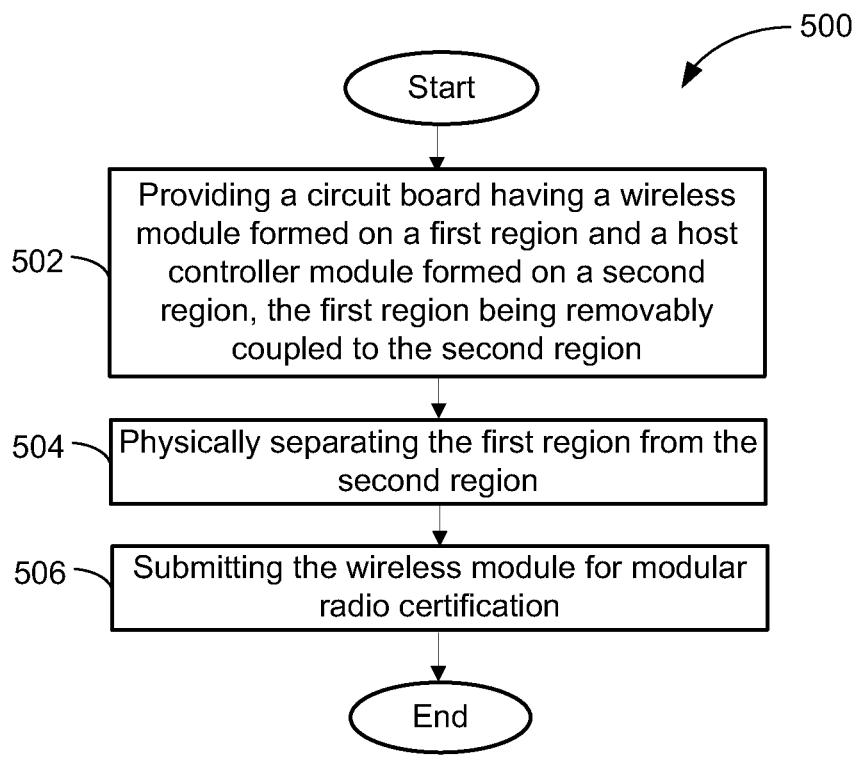
FIG. 5 schematically illustrates a flow diagram of a method of preparing a wireless module for modular radio certification.

FIG. 5 schematically illustrates a flow diagram of a method 500 of preparing a wireless module for modular radio certification. At 502, the method 500 includes providing a circuit board having a wireless module formed on a first region and a host controller module formed on a second region, the first region being removably coupled to the second region. For example, the circuit board provided at 502 can be a product of method 300.

At 504, the method 500 includes physically separating the first region from the second region. The first region can be physically separated from the second region by applying mechanical force to a structure such as a perforation formed between the first region and the second region. Physically separating the first region from the second region provides a specimen (e.g., the specimen 200 of FIG. 2) that can be submitted for modular radio certification.

At 506, the method 500 includes submitting the wireless module for modular radio certification. As previously described in connection with FIG. 1, the modular radio certification can include a wide variety of certification processes performed by a wide variety of certifying bodies.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments. Operations of methods 300, 400, and 500 can be suitably combined and may comport with techniques and/or configurations described in connection with FIGS. 1 and 2 in various embodiments.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An assembly comprising:
  circuitry of a wireless module, wherein the circuitry of the wireless module is disposed on a first region of a circuit board; and
  circuitry of a host controller module,
  wherein the circuitry of the host controller module is disposed on a second region of the circuit board,
  wherein the first region is removably coupled to the second region using a perforation formed along a linear boundary,
  wherein the first region includes a first plurality of trace structures that abuts the linear boundary,
  wherein the second region includes a second plurality of trace structures that abuts the linear boundary, and
  wherein a trace structure of the first plurality of trace structures is directly and physically coupled to a corresponding trace structure of the second plurality of trace structures.

2. The assembly of claim 1, wherein:
  the host controller module comprises a printer formatter module; and
  circuitry of the printer formatter module comprises an application specific integrated circuit (ASIC) die.

3. The assembly of claim 1, wherein the circuitry of the wireless module comprises radio circuitry configured to communicate using an Institute for Electrical and Electronic Engineers (IEEE) 802.11 standard.

4. The assembly of claim 1, wherein the first region and the second region are separated by a linear boundary that separates the circuitry of the wireless module from the circuitry of the host controller module.

5. The assembly of claim 1, wherein:
  the first region primarily includes the circuitry of the wireless module;
  the second region primarily includes the circuitry of the host controller module; and
  the circuit board primarily includes the first region and the second region.

6. An assembly comprising:
  circuitry of a wireless module, wherein the circuitry of the wireless module is disposed on a first region of a circuit board; and
  circuitry of a host controller module,
  wherein the circuitry of the host controller module is disposed on a second region of the circuit board,
  wherein the first region and the second region are separated by a linear boundary that separates the circuitry of the wireless module from the circuitry of the host controller module,
  wherein the first region is removably coupled to the second region using a perforation formed along the linear boundary,
  wherein the perforation includes one or more openings formed through the circuit board along the linear boundary, and
  wherein at least one opening of the one or more openings has an L-shape.

7. An assembly comprising:
  circuitry of a wireless module, wherein the circuitry of the wireless module is disposed on a first region of a circuit board; and
  circuitry of a host controller module,
  wherein the circuitry of the host controller module is disposed on a second region of the circuit board,
  wherein the first region is removably coupled to the second region,
  wherein the first region and the second region are separated by a linear boundary that separates the circuitry of the wireless module from the circuitry of the host controller module,
  wherein the first region includes a plurality of trace structures that abuts the linear boundary,
  wherein the plurality of trace structures comprise finger structures that are disposed parallel to one another, and wherein the plurality of trace structures operate in accordance with one of a Universal Serial Bus (USB) specification and a Secure Card (SD) memory card specification.

8. An assembly comprising:
circuitry of a wireless module, wherein the circuitry of the wireless module is disposed on a first region of a circuit board; and
circuitry of a host controller module,
wherein the circuitry of the host controller module is disposed on a second region of the circuit board,
wherein the first region is removably coupled to the second region,
wherein the first region and the second region are separated by a linear boundary that separates the circuitry of the wireless module from the circuitry of the host controller module,
wherein the first region includes a plurality of trace structures that abuts the linear boundary,
wherein each of the plurality of trace structures is electrically coupled to a respective contact of a plurality of contacts formed in the first region, and
wherein at least one of (i) the plurality of trace structures or (ii) the plurality of contacts serves as a connection point for an equipment that performs a modular radio certification process on the wireless module.

9. An assembly comprising:
circuitry of a wireless module, wherein the circuitry of the wireless module is disposed on a first region of a circuit board; and
circuitry of a host controller module,
wherein the circuitry of the host controller module is disposed on a second region of the circuit board,
wherein the first region is removably coupled to the second region,
wherein the first region and the second region are separated by a linear boundary that separates the circuitry of the wireless module from the circuitry of the host controller module,
wherein the first region includes a first plurality of trace structures that abuts the linear boundary,
wherein the second region includes a second plurality of trace structures,
wherein each trace structure of the second plurality of trace structures (i) abuts the linear boundary and (ii) is electrically coupled to a trace structure of the first plurality of trace structures, and
wherein the assembly further comprises
a tri-state contact disposed in the second region, the tri-state contact to place the second plurality of trace structures in a high impedance state that allows radio calibration of the wireless module as though the host controller module is not coupled to the wireless module.

10. An assembly comprising:
circuitry of a wireless module, wherein the circuitry of the wireless module is disposed on a first region of a circuit board; and
circuitry of a host controller module,
wherein the circuitry of the host controller module is disposed on a second region of the circuit board,
wherein the first region is removably coupled to the second region,
wherein the first region and the second region are separated by a linear boundary that separates the circuitry of the wireless module from the circuitry of the host controller module,
wherein the first region includes a first plurality of trace structures that abuts the linear boundary,
wherein the second region includes a second plurality of trace structures,
wherein each trace structure of the second plurality of trace structures (i) abuts the linear boundary and (ii) is electrically coupled to a trace structure of the first plurality of trace structures, and
wherein the assembly further comprises
a plurality of tooling connectors disposed in the first region, and
at least one tooling connector disposed in the second region, wherein the plurality of tooling connectors and the at least one tooling connector are configured to orient a tool that is used to test or calibrate the wireless module.

* * * * *